(12) United States Patent
Jager et al.

(10) Patent No.: US 8,927,317 B2
(45) Date of Patent: Jan. 6, 2015

(54) METHOD FOR PRODUCING A SELECTIVE DOPING STRUCTURE IN A SEMICONDUCTOR SUBSTRATE IN ORDER TO PRODUCE A PHOTOVOLTAIC SOLAR CELL

(75) Inventors: Ulrich Jager, Freiburg (DE); Daniel Biro, Freiburg (DE); Anne-Kristin Volk, Freiburg (DE); Johannes Seiffe, Freiburg (DE); Sebastian Mack, Freiburg (DE); Andreas Wolf, Freiburg (DE); Ralf Preu, Freiburg (DE)

(73) Assignees: Fraunhofer-Gesellschaft zur Förderung der Angewandten Forschung E.V., München (DE); Albert-Ludwigs-Universität Freiburg, Freiburg (DE)

( * ) Notice: Subject to any disclaimer, the term of this patent is extended or adjusted under 35 U.S.C. 154(b) by 197 days.

(21) Appl. No.: 13/805,111

(22) PCT Filed: Jun. 16, 2011

(86) PCT No.: PCT/EP2011/002965
§ 371 (c)(1),
(2), (4) Date: Feb. 28, 2013

(87) PCT Pub. No.: WO2012/000612
PCT Pub. Date: Jan. 5, 2012

(65) Prior Publication Data
US 2013/0157401 A1    Jun. 20, 2013

(30) Foreign Application Priority Data
Jun. 18, 2010   (DE) .......................... 10 2010 024 308

(51) Int. Cl.
| | |
|---|---|
| H01L 31/18 | (2006.01) |
| H01L 21/225 | (2006.01) |
| H01L 21/268 | (2006.01) |
| H01L 31/0224 | (2006.01) |
| H01L 31/068 | (2012.01) |

(52) U.S. Cl.
CPC ............ *H01L 31/18* (2013.01); *H01L 21/2254* (2013.01); *H01L 21/268* (2013.01); *H01L 31/022425* (2013.01); *H01L 31/068* (2013.01); *Y02E 10/547* (2013.01)
USPC .......................................................... 438/61

(58) Field of Classification Search
None
See application file for complete search history.

(56) References Cited

U.S. PATENT DOCUMENTS

| | | |
|---|---|---|
| 6,429,037 B1 | 8/2002 | Wenham et al. |
| H2207 H | 12/2007 | Bijker |

(Continued)

FOREIGN PATENT DOCUMENTS

WO    2010012062    2/2010

OTHER PUBLICATIONS

Carlsson, C. et al. Laser Doping for Selective Silicon Solar Cell Emitter. In 21st European Photovoltaic Solar Energy Conference, Dresden. 2006, pp. 938-940.
Sterk S. et al., "High Efficiency (22%) Si-Solar Cells with Optimized Emitter", World Conference on Photovoltaic Energy, Dec. 5-9, 1994, Bd. CONF. 1, pp. 1303-1306.

(Continued)

*Primary Examiner* — Seahvosh Nikmanesh
(74) *Attorney, Agent, or Firm* — Volpe and Koenig, P.C.

(57) ABSTRACT

A method for producing a selective doping structure in a semiconductor substrate in order produce a photovoltaic solar cell. The method includes the following steps: A) applying a doping layer (2) to the emitter side of the semiconductor substrate, B) locally heating a melting region of the doping layer (2) and a melting region of the semiconductor substrate lying under the doping layer (2) in such a way that dopant diffuses from the doping layer (2) into the melted semiconductor substrate via liquid-liquid diffusion, so that a high doping region (3) is produced after the melt mixture solidifies, C) producing the planar low doping region by globally heating the semiconductor substrate, D) removing the doping layer (2) and E) removing or converting a layer of the semiconductor substrate on the doping side in such a way that part of the low doping region and of the high doping region close to the surface is removed or is converted into an electrically non-conducting layer.

17 Claims, 4 Drawing Sheets

(56) References Cited

U.S. PATENT DOCUMENTS

2009/0020158 A1    1/2009  Ohtsuka et al.
2009/0071540 A1    3/2009  Klein et al.
2012/0301995 A1*  11/2012  Suwito et al. .................. 438/69
2013/0095595 A1*   4/2013  Mack et al. .................... 438/71

OTHER PUBLICATIONS

Kohler, J.R. et al., "Laser Doped Selective Emitters Yield 0.5% Efficiency Gain,", 24th European Photovoltaic Solar Energy Conference, Sep. 21, 2009, pp. 1847-1850.

* cited by examiner

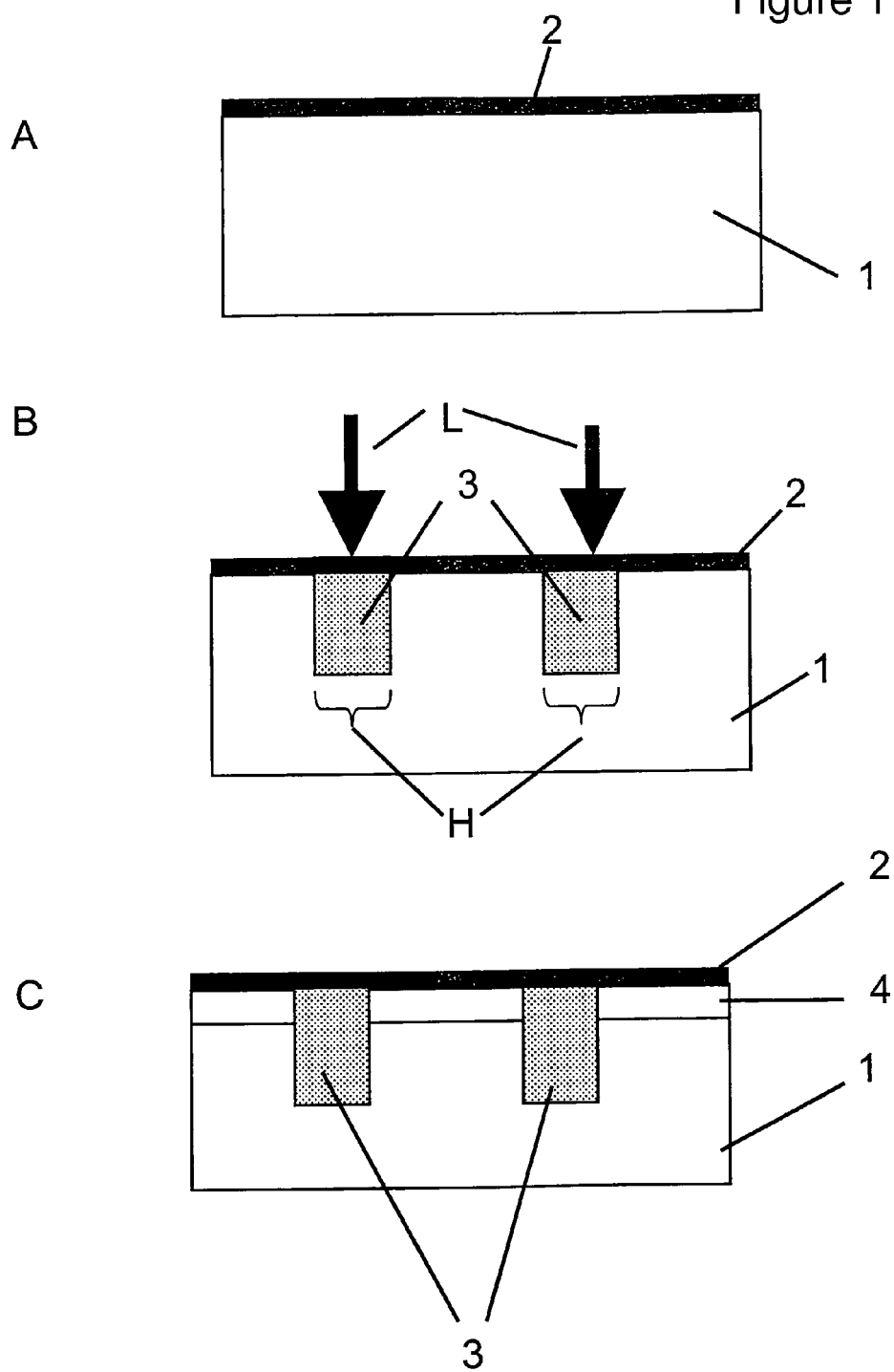
Figure 1 (A-C)

Figure 1 (D-E1)
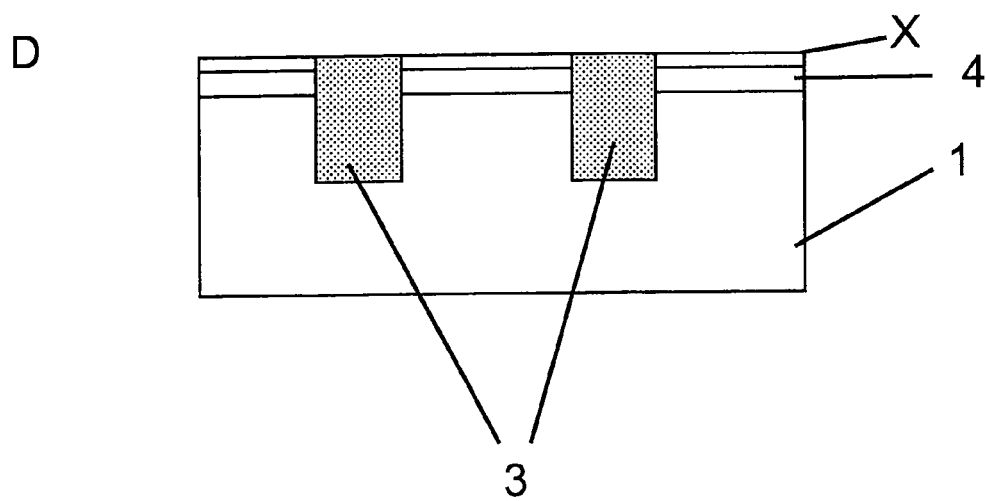
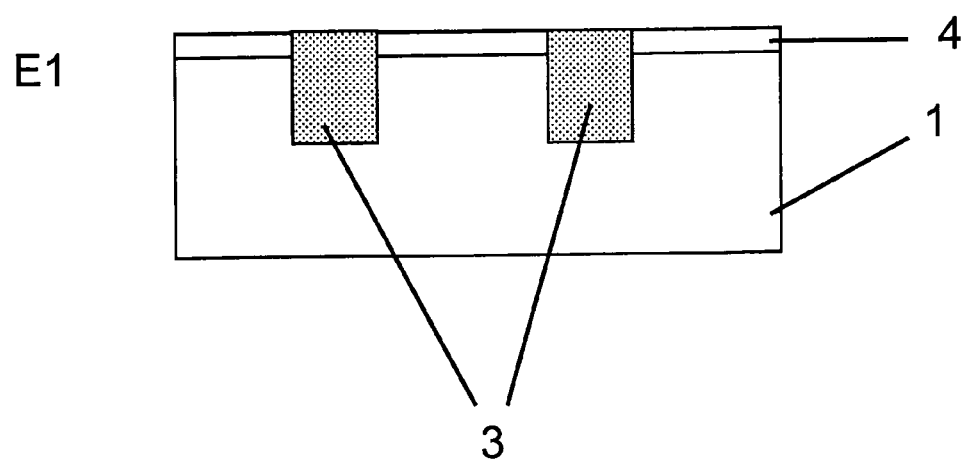

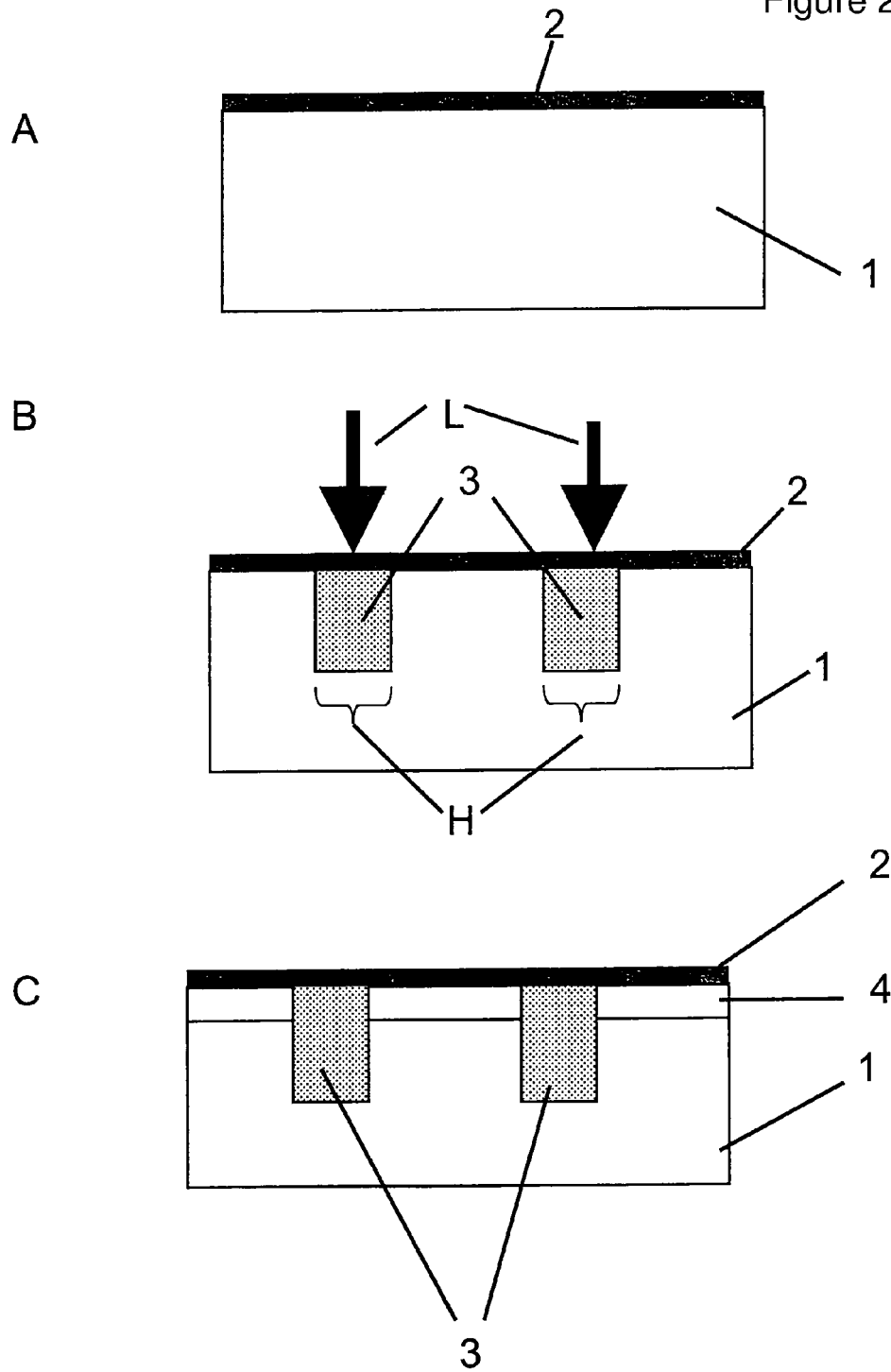
Figure 2 (A-C)

Figure 2 (D-E2)
D
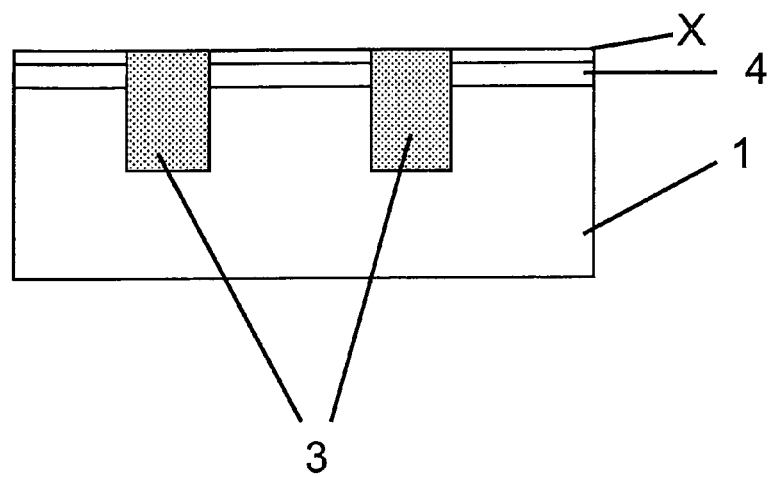
E2
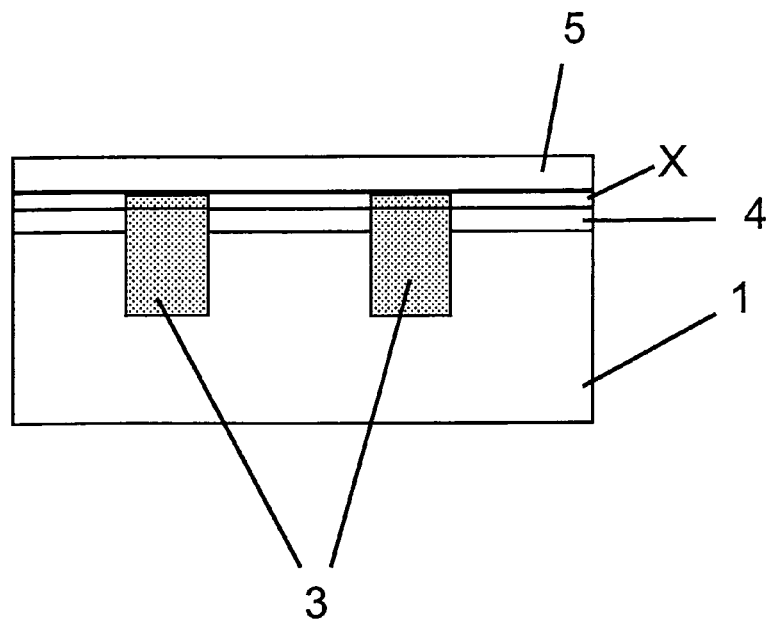

METHOD FOR PRODUCING A SELECTIVE DOPING STRUCTURE IN A SEMICONDUCTOR SUBSTRATE IN ORDER TO PRODUCE A PHOTOVOLTAIC SOLAR CELL

BACKGROUND

The invention relates to a method for producing a selective doping structure on a semiconductor substrate in order to produce a photovoltaic solar cell.

A photovoltaic solar cell is a planar semiconductor element in which generation of electron-hole pairs is achieved by means of incident electromagnetic radiation and charge carrier separation is effected at at least one pn junction, such that an electrical potential difference arises between at least two electrical contacts of the solar cell and electrical power can be tapped off from the solar cell via an external electrical circuit connected to said contacts.

Typical solar cells comprise a semiconductor substrate having a base doping, wherein at least one emitter region having an emitter doping, which is opposite to the base doping, is formed in the semiconductor substrate, such that the abovementioned pn junction forms between base region and emitter region. Contact is made with base region and emitter region in each case by at least one metallic contact structure for collecting and carrying away the charge carriers.

In order to achieve high efficiencies, an optimization has to be effected with regard to a number of loss mechanisms: thus, a high doping is advantageous for forming a low electrical contact resistance between metallization and contact-connected semiconductor region. On the other hand, a higher doping leads, in principle, to a higher recombination of electron-hole pairs within the semiconductor substrate.

It is therefore known, both in the emitter region and in the base region, to form selective doping structures.

Thus, the formation of selective emitter structures is known, for example, in which, for example, on the front side of the semiconductor substrate facing the light, an emitter having a first doping profile is formed in a planar fashion and a second emitter profile having a higher doping than the first profile is formed only in the regions in which contact is intended to be made with the emitter by a metallic emitter contact structure applied to the front side of the semiconductor structure. Such a selective emitter ensures that, in the case of transverse conduction of the charge carriers within the emitter region of the first emitter profile, a reduction of the recombination is achieved and, on the other hand, a low contact resistance with respect to the metallic contact structure is achieved on account of the higher doping of the second doping profile.

Various methods have been proposed for industrially implementing the production of selective emitters: thus, Haverkamp, H., et al. Minimizing the Electrical Losses on the Front Side: Development of a Selective Emitter Process from a Single Diffusion. in $33^{rd}$ IEEE PVSC. 2008. San Diego, describes the production of a selective emitter by means of homogenous diffusion of an emitter region, subsequent masking and wet-chemical, partial etching-back of the semiconductor substrate. Furthermore, Bultmann, J. H., et al. Single Step selective emitter using diffusion barriers. in $16^{th}$ EU PVSEC.2000. Glasgow, describes the production of a selective emitter structure by applying and patterning a semitransparent diffusion barrier. Furthermore, Jäger, U., et al. Selective emitter by laser doping from phosphosilicate glass. in Proceedings of the $24^{th}$ European Photovoltaic Solar Energy Conference. 2009. Hamburg, Germany, describes the production of a selective emitter structure by selective laser doping.

The abovementioned methods require in some instances complex and cost-intensive masking steps or lead to emitter profiles which, on account of the profile progression, still significantly exhibit recombination losses and thus reductions of efficiency.

SUMMARY

Therefore, the present invention is based on the object of providing a method for producing a selective doping structure on a semiconductor substrate in order to produce a photovoltaic solar cell, which method makes it possible to produce selective doping structures in an industrially implementable and cost-effective manner.

This object is achieved by a method as claimed in the invention. Advantageous configurations of the method according to the invention are described below and in the claims.

The method according to the invention serves for producing a selective doping structure in a semiconductor substrate in order to produce a photovoltaic solar cell. The selective doping structure is formed at least at a doping side of the semiconductor substrate, wherein at the doping side at least one planar low doping region of a first doping profile is produced in the semiconductor substrate and at least one local high doping region of a second doping profile is produced within the first low doping region. In this case, the low doping region and the high doping region are formed with the same doping type, wherein the high doping region has a lower transverse conduction resistance than the low doping region. In this case, doping types are the n-type doping and the p-type doping opposite thereto. The doping side is the front or back side of the semiconductor substrate.

What is essential is that the method according to the invention comprises the following method steps:

A method step A involves applying a dopant-containing doping layer to the doping side of the semiconductor substrate.

A method step B involves locally heating a melting region of the doping layer and a melting region—situated below the doping layer—of the semiconductor substrate, in such a way that a melt mixture comprised of at least the melting region of the doping layer and the melting region of the semiconductor substrate momentarily forms in a local region, wherein, by means of liquid-liquid diffusion, dopant diffuses from the doping layer into the molten semiconductor substrate, such that the high doping region is produced after the solidification of the melt mixture.

A method step C involves producing the planar low doping region, in which the semiconductor substrate is globally heated, in such a way that dopant diffuses from the doping layer into the semiconductor substrate.

A method step D involves removing the doping layer.

Furthermore, a method step E involves removing and/or converting a layer of the semiconductor substrate at the doping side. In this case, a method step E1 involves removing a part of the low doping region and of the high doping region that is near the surface, and/or a method step E2 involves converting a layer of the semiconductor substrate at the doping side into an electrically non-conductive layer.

In this case, method steps A to E mentioned above are performed in the sequence A, B, C, D, E or A, C, B, D, E, wherein it is in each case within the scope of the invention if appropriate to interpose further intermediate steps.

By means of the method according to the invention, a selective doping structure is achieved in a cost-effective and industrially implementable manner. Firstly, by means of the doping layer which produces the planar emitter region having low doping as a result of global heating of the semiconductor substrate in method step C and produces the high doping region or regions as a result of local heating in method step B, a selective doping profile is created in a simple manner, without this necessitating cost-intensive masking steps. This stems from the fact, in particular, that in method step C the thermal diffusion from the doping layer into the semiconductor substrate takes place significantly more slowly compared with the local liquid-liquid diffusion in the temporarily molten local regions in method step B. The different diffusion mechanisms already ensure that a doping region having lower doping is produced in method step C, compared with the doping regions produced in method step B.

It is furthermore essential that method step E involves removing and/or converting a layer at the doping side of the semiconductor substrate. This stems from the applicant's insight that the different diffusion processes mentioned above also give rise to different doping profiles, that is to say different progressions of the doping concentration, proceeding from the surface of the semiconductor substrate in a direction perpendicular to the surface of the semiconductor substrate:

Method step C typically gives rise to so-called "kink and tail" doping profiles, i.e. doping profiles which have a very high doping concentration in a region near the surface, followed by a sharp fall and finally a flatter progression. This is known per se and described for example in Bentzen, A. et al. High concentration in-diffusion of phosphorus in Si from a spray-on source, Journal of Applied Physics, 99 (2006) p. 064502-1-8. Such a doping profile arises in particular during the thermal production of the emitter from an inexhaustible source, particularly when using phosphorus as dopant.

The liquid-liquid diffusion in method step B, by contrast, gives rise to a doping profile that approximately corresponds to a Gaussian doping profile, that is to say that, proceeding from the surface, the doping concentration falls continuously, but significantly more slowly compared with a kink and tail profile.

If a layer is then removed at the surface of the doping side of the semiconductor substrate in method step E, this leads to a considerable reduction of the surface concentration of the dopant in the low doping region, since the highly doped region of the kink and tail profile that is near the surface is entirely or partly removed and/or converted into an electrically non-conductive layer. At the local high doping region or regions produced in method step B, by contrast, as mentioned above, at least approximately a Gaussian doping profile is present, that is to say that removing the layer in method step E leads only to a comparatively small reduction of the surface doping concentration. Furthermore, these effects can be achieved by means of the method according to the invention without masking steps being required for this purpose.

As a result, therefore, in the low doping regions the surface doping concentration is considerably reduced in method step E, such that in said regions the recombination activity, in particular on account of Auger recombination and phosphorus precipitates, for example, is considerably reduced and losses of efficiency are thus avoided. This effect is described for example in Nguyen, V. et al., Analysis of Screen-Printed Silicon Solar Cell Emitters in Proceedings 24th EU PVSEC, Hamburg, 2009.

In the high doping regions, by contrast, no or only a negligibly small reduction of the surface doping concentration is effected in method step E, such that a low contact resistance between semiconductor substrate and metallic contact structure is still ensured on account of the high surface doping concentration.

Furthermore, as a result of removing/converting the layer near the surface in step E1 and/or E2, it is possible to remove or electrically activate defects near the surface, such as precipitates of dopant, for instance, and thus to eliminate their contribution to the recombination.

The method according to the invention therefore makes it possible to produce, in an optimized manner, a selective doping structure which, firstly, can be incorporated cost-effectively into industrial manufacturing processes, in particular on account of the reduction or avoidance of masking steps, and secondly makes possible a high total efficiency of the finished solar cell, in particular since in method step E the surface doping concentration is considerably reduced in the low doping regions, but not in the high doping regions.

Method steps A to E of the method according to the invention are performed without the interposition of masking steps, in order to save costs.

This furthermore distinguishes the method according to the invention from previously known methods for producing selective doping structures in which a plurality of cost-intensive masking steps are required.

Preferably, high and low doping regions are formed in such a way that the high doping region has a surface doping concentration identical to or higher than that of the low doping region.

The local heating in method step B is preferably effected by means of a laser. In this case, it is possible to have recourse to methods known per se for laser doping, as described for example in Jäger, U., et al. Selective emitter by laser doping from phosphosilicate glass. in Proceedings of the 24th European Photovoltaic Solar Energy Conference. 2009. Hamburg, Germany.

The laser doping process is preferably carried out using pulsed lasers having a wavelength in a range of 190 nm to 1100 nm. Advantageous pulse lengths include lengths of 1 ps to 5 µs depending on the repetition rate chosen. Preferably, a laser having a wavelength of 343, 355, 515 or 532 nm with pulse lengths in the range of 10-500 ns is chosen. It is likewise possible to carry out the doping process using a laser in continuous wave operation ("cw"=continuous wave) or a cw laser in modulated operation at the stated wavelengths.

Method step E preferably involves removing and/or converting a layer with a predefined thickness, such that the surface doping concentration of the low doping region at the doping side after removal of the layer is less than $4 \times 10^{20}$ cm$^{-3}$, preferably less than $2 \times 10^{20}$ cm$^{-3}$, in particular preferably less than $1 \times 10^{20}$ cm$^{-3}$, further preferably less than $5 \times 10^{19}$ cm$^{-3}$. This ensures a considerable reduction of, in particular, the Auger recombination and, if appropriate, the removal of undesirable phosphorus participates in the low doping region.

Investigations by the applicant have revealed that in a configuration of the method according to the invention by removing a layer in method step E1 a layer with a thickness of between 1 nm and 300 nm is preferably removed, and/or in a configuration of the method by converting a layer in method step E2 a layer with a thickness of between 1 nm and 300 nm is converted.

This ensures, for the conventional process parameters, in particular the conventional doping profiles, a sufficient reduction of the surface doping concentration in the low doping regions in order to reduce the Auger recombination.

Preferably, method step E involves removing and/or converting a layer of the semiconductor substrate, i.e. a crystalline structure of the crystalline semiconductor substrate. This is in contrast to previously known processes, for example, in which so-called PSG glass is removed after a diffusion step since only amorphous structures are removed and/or converted in these steps. Preferably, method step E involves removing and/or converting a layer of the semiconductor substrate with a thickness in the range of 5 nm to 200 nm, preferably 50 nm to 200 nm.

Method step D preferably involves removing the doping layer in a planar manner. In particular, it is advantageous to remove the entire doping layer in method step D.

The doping layer applied in method step A preferably has a thickness of between 10 nm and 1 µm, preferably between 10 nm and 500 nm, with further preference between 10 nm and 100 nm. This ensures that enough dopant is present for the subsequent doping processes, in particular an unlimited dopant source for the production of the low doping region.

The doping layer to be applied in method step A is preferably produced by one of the following methods: chemical vapor deposition (CVD); the latter has the advantage of good homogeneity and process control; physical vapor deposition (PVD) or cathode sputtering; these likewise have the advantage of good homogeneity and process control; applying a liquid dopant by spraying or a spin-on process or printing (e.g. dilute phosphoric acid); this has the advantage that a very cost-effective method is involved; growing doped silicate glasses in a tubular furnace (e.g. phosphosilicate glass (PSG) or borosilicate glass (BSG)); this has the advantage that the layers produced in this way have a very high quality.

Furthermore, it is advantageous for the doping layer to comprise dopant in a concentration of at least 1 percent by weight, preferably at least 4 percent by weight, with further preference in the range of 6 percent by weight to 10 percent by weight. This ensures that enough dopant is present for the subsequent doping processes, in particular an unlimited dopant source for the production of the low doping region.

In one advantageous embodiment of the method, the method step are carried out in the order A, C, B, D, E, and steps A and C are carried out directly successively, without the interposition of intermediate steps and in one installation. Investigations by the applicant have revealed that this is advantageous for the thermal emitter formation particularly when using tubular furnaces. Preferably, method steps A and C are carried out simultaneously.

Preferably, in the method according to the invention after method step E in a method step F a protective layer is applied to the doping side of the semiconductor substrate. This prevents the recombination rate of this surface from being adversely affected and in particular worsened. Preferably, the protective layer is simultaneously embodied as an antireflection layer for increasing the coupling-in of light. In particular, a configuration of the protective layer as a silicon nitride layer or silicon oxide layer is advantageous. The thickness of the protective layer is preferably in the range of 50 to 120 nm. In this case, the optical refractive index of the layers is preferably in a range of 1.3 to 2.5. It is also within the scope of the invention to deposit a plurality of layers as protective and antireflection layer.

Method step A involves applying the doping layer preferably in a manner covering the entire doping side of the semiconductor substrate.

As explained above, in the method according to the invention a method step E1 involves removing a part of the low doping region and of the high doping region that is near the surface, or a method step E2 involves converting a layer of the semiconductor substrate at the doping side into an electrically non-conductive layer. A combination of method steps E1 and E2 is likewise within the scope of the invention.

In one preferred embodiment of the method according to the invention, only method step E1 is carried out in method step E, that is to say that a layer of the semiconductor substrate is removed at the doping side. This has the advantage that the substrate can be processed in a manner free of masking. Preferably, the layer is removed by means of wet-chemical etching, in particular preferably by means of a mixture composed of hydrofluoric acid (HF), nitric acid ($HNO_3$), acetic acid ($CH_3COOH$) and water ($H_2O$). The removal is preferably effected in a manner comprising the following method steps: an etching solution is used to form a layer of porous silicon, which is then removed in a short second etching step by means of potassium hydroxide (KOH) diluted in the water. Rinsing in water ($H_2O$) is subsequently performed.

Furthermore, the removal of the layer near the surface can be effected by means of one or a plurality of successively performed SC1/SC2 cleanings. Solutions containing hydrofluoric acid are likewise possible.

Furthermore, the removal of the layer near the surface can be effected by means of hydrofluoric acid (HF) with addition of surfactants, preferably using more highly concentrated hydrofluoric acid.

Furthermore, the removal of the layer near the surface can be effected by means of phosphoric acid ($H_3PO_4$).

Furthermore, the removal of the layer near the surface can be effected by means of sulfuric acid ($H_2SO_4$) or $H_2SO_4$ diluted in $H_2O$.

Furthermore, the removal of the layer near the surface can be effected by means of potassium hydroxide (KOH) dissolved in $H_2O$.

Furthermore, the removal of the layer near the surface can be effected by means of sodium hypochloride (NaOCl) dissolved in $H_2O$.

In a further preferred embodiment of the method according to the invention, in method step E1 the layer removal is carried out by means of plasma enhanced etching.

In a further preferred embodiment of the method according to the invention, in method step E2 the layer conversion is effected by means of thermal oxidation. As a result of a silicon dioxide layer being grown thermally on the doping side of the semiconductor substrate, a layer of the semiconductor substrate that is near the surface is converted into silicon dioxide. It is true that this does not alter the absolute doping concentration in the low doping and high doping regions. However, the doping concentration in the electrically active region of the semiconductor substrate at the doping side is crucial for the electrical property of the solar cell and in particular the loss mechanisms in the low doping region. The layer conversion into an electrically non-active layer therefore likewise leads to a reduction of the electrically active surface doping concentration in the low doping region, such that, as explained above, in particular a reduction of the Auger recombination is achieved, and if appropriate resolution of phosphorus precipitates.

Forming the thermal oxide in method step E2 is preferably effected comprise the following method steps: a thermal oxide forms if the semiconductor substrate is exposed to high temperatures, preferably temperatures of above 650° C., and to an oxidizing atmosphere. This atmosphere preferably consists of water vapor or oxygen gas or a combination of both. The admixture of chlorine-containing chemicals is advantageous. The admixture of further gases such as, for example, nitrogen or some other inter-gassing for diluting the gas atmosphere is within the scope of the invention. Furthermore, the thermal oxide can be produced at elevated pressure (greater than 1 bar) in order to reduce the oxidation time necessary for the desired thickness. This is because the oxidation rate increases with higher pressure.

Furthermore, as a result of removing/converting the layer near the surface in step E1 and/or E2, it is possible to remove or electrically deactivate defects near the surface, such as precipitates of dopant, for instance, and thus to eliminate their contribution to the recombination.

In a further preferred embodiment of the method according to the invention, in method step E2 the layer growth for conversion into an oxide is performed wet-chemically. This converted layer is removed in a method step following E2, preferably using hydrofluoric acid.

The method according to the invention is suitable in particular for forming a selective emitter and, in this case in particular, a selective emitter at the front side of the semiconductor substrate, said front side being designed for the coupling-in of light. In this case, low and high doping regions thus have an emitter doping type that is opposite to a base doping type of the semiconductor substrate. This is possible for any desired combinations of doping types, that is to say for forming an n-doped emitter on a p-doped base, or vice versa.

Likewise, however, the method according to the invention is also suitable for producing selective dopings of the base doping type: here low and high doping regions of the base doping type are produced, wherein the low doping region has a higher doping concentration than the base doping concentration of the semiconductor substrate and the high doping region in turn has a higher doping concentration than the low doping region. Such a configuration is advantageous in particular for forming a back side of a solar cell having high electrical quality and a low contact resistance.

The passivation mechanisms of such doping regions of the base doping type are known as so-called "back surface field".

Such a configuration is likewise advantageous for forming selective doping for a front side with high electrical quality of a solar cell.

The passivation mechanisms of such doping regions of the base doping type are known as so-called "front surface field".

The doping side is preferably that side of the solar cell at which a selective emitter is formed.

The doping side is preferably that side of the solar cell which faces the incident electromagnetic radiation during operation.

Preferably, the high doping region or regions is or are formed in a manner covering those regions of the doping side of the semiconductor substrate at which a metallic contact structure is applied to the doping side of the semiconductor substrate in later method steps. As explained above, this ensures a low contact resistance between metallic contact structure and semiconductor substrate.

In method step B local heating of the semiconductor substrate to at least 1410° C. is preferably effected in order to ensure local melting and the abovementioned liquid-liquid diffusion.

In order to simplify the method and reduce costs, preferably in method steps B and C the doping regions are produced in such a way that the low doping region is applied in a manner completely covering the doping side of the semiconductor substrate and a multiplicity of high doping regions are formed. In particular forming the low doping region in a manner that completely covers the doping side can be carried out in a simple manner in terms of method engineering, in particular by virtue of the fact that in method step A the doping layer is applied in a manner completely covering the doping side of the semiconductor substrate. High and low doping regions are preferably formed parallel to the surface of the semiconductor substrate at the doping side.

The layer removed and/or converted in method step E at the doping side of the semiconductor substrate is likewise preferably a layer parallel to the doping side.

The method according to the invention is suitable in particular for forming selective doping structures in silicon solar cells, equally in solar cells based on monocrystalline, multicrystalline or microcrystalline silicon wafers.

Preferably, method step A involves applying the doping layer which contains at least phosphorus as dopant, preferably exclusively phosphorus as dopant.

BRIEF DESCRIPTION OF THE DRAWINGS

Further features and preferred embodiments of the invention will become apparent from the figures and the description of the figures, in which:

FIG. 1 shows a first exemplary embodiment of the method according to the invention, wherein a method step E1 involves removing a layer at the doping side of the semiconductor substrate, and FIG. 2 shows a second exemplary embodiment of the method according to the invention, wherein a method step E2 involves converting a layer of the semiconductor substrate at the doping side into an electrically non-conducting layer.

DETAILED DESCRIPTION OF THE PREFERRED EMBODIMENTS

FIGS. 1 and 2 in each case illustrate partial excerpts from a semiconductor substrate 1 embodied as a silicon wafer. The semiconductor substrate has a p-type doping of $N_A=1.5E16$ $cm^{-3}$ and continues in each case toward the right and left. The semiconductor substrate 1 has a thickness of 200 μm and is embodied in a square fashion, for instance, with an edge length of 15 cm.

Identical reference signs in FIGS. 1 and 2 designate identical elements.

In the first exemplary embodiment of the method according to the invention, as illustrated in FIG. 1, a method step A involves applying a doping layer 2 to the top front side of the semiconductor substrate 1, which is designed for coupling in light in the case of the solar cell to be produced.

The doping layer 2 is deposited by means of chemical vapor deposition (CVD) and consists of $SiO_x$:P (phosphosilicate glass "PSG") having the dopant phosphorus in a concentration of 4-8% by weight.

In a method step B, by means of local heating by a laser beam L in a local region H, a melt mixture composed of the doping layer 2 and the semiconductor substrate 1 is momentarily produced within the line illustrated in a dashed fashion in FIG. 1B. Within the melt mixture, a liquid-liquid diffusion of the dopant from the doping layer 2 into the semiconductor substrate 1 is effected, such that, after the solidification of the melt layer, a high doping region 3 is present in the semiconductor substrate, said high doping region having a doping concentration of approximately $4E20$ $cm^{-3}$ at the surface of the semiconductor substrate 1.

The local melting is effected by a laser having a wavelength of 532 nm, wherein the laser is operated in a pulsed fashion with a pulse length in the range of 10 ns to 500 ns.

A method step C involves globally heating the semiconductor substrate 1 in a continuous furnace to a temperature of 850° C. for a time duration of 30 min. This results in a diffusion of dopant from the doping layer 2 into the semiconductor substrate 1 at the doping side of the semiconductor substrate, such that a low doping region 4 forms. On account of this process, the low doping region has a kink and tail profile, as described for example in Bentzen, A. et al. High concentration in-diffusion of phosphorus in Si from a spray-on source, Journal of Applied Physics, 99 (2006) p. 064502-1-8, with a surface doping concentration of 5E20 cm$^{-3}$ and a sheet resistance of 50 ohms/sq (before method step E).

The sheet resistance of the high doping region 3 produced in method step B is, by contrast, 20 ohms/sq.

In a method step D, the doping layer 2 is removed by the following wet-chemical process: etching for less than 2 minutes in 10% hydrofluoric acid (HF) in $H_2O$, subsequent rinsing in $H_2O$.

Subsequently, a method step E1 involves removing a layer at the doping side of the semiconductor substrate 1 with a thickness of 50 nm. This thickness is identified by X in FIG. 1D.

The result is illustrated in FIG. 1, E1. The layer is likewise removed by means of a wet-chemical method, comprising the following method steps: an etching solution (mixture of hydrofluoric acid (HF), nitric acid ($HNO_3$), acetic acid ($CH_3COOH$) and water ($H_2O$)) is used to form a layer of porous silicon, which is then removed in a short second etching step by potassium hydroxide (KOH) diluted in water. Rinsing in water ($H_2O$) is subsequently performed.

The removal of the layer at the doping side of the semiconductor substrate 1 in method step E1 leads to a reduction of the surface concentration of the low doping region 4 from 5E20 cm$^{-3}$ to 2E20 cm$^{-3}$ by virtue of the removal of the highly doped region near the surface of the kink and tail profile with the layer. In this case, however, the sheet resistance of the low doping region changes only slightly from 20 ohms/sq, to 25 ohms/sq, such that firstly the recombination in the low doping region is considerably reduced, but the transverse conductivity is approximately still not adversely affected.

In the high doping region 3, which has an approximately Gaussian doping profile on account of the liquid-liquid diffusion, the surface doping concentration is merely reduced from 4E20 cm$^{-3}$ to 3.8E20 cm$^{-3}$, however, as a result of the removal of the layer in method step E1. This ensures that after the removal of the layer when a metallic contact structure is applied to the semiconductor substrate in the high doping region 3 a low contact resistance is ensured on account of the high surface doping concentration.

FIG. 2 illustrates a second exemplary embodiment of the method according to the invention, wherein method steps A to D are carried out identically to the first exemplary embodiment. Subsequently, however, method step E2 involves converting a layer at the doping side of the semiconductor substrate 1 into an electrically non-conductive layer. The conversion is achieved by virtue of the fact that by means of global heating of the semiconductor substrate 1 in an oxygen gas atmosphere or water vapor gas atmosphere a silicon layer 5 is formed at the doping side of the semiconductor substrate 1, which, however, likewise converts a layer near the surface and having the thickness of 10 nm (marked by X in FIG. 2) of the semiconductor substrate 1 into a silicon oxide layer. This region of the semiconductor substrate 1 that is converted into a silicon oxide layer is therefore electrically inactive and not relevant to the consideration of the electrical properties, in particular of the recombination processes.

By means of the conversion, therefore, analogously to the exemplary embodiment described in FIG. 1, the low doping region is altered in such a way that the surface doping concentration of the low doping region that is relevant to the electrical properties is reduced from 5E20 cm$^{-3}$ to 2E20 cm$^{-3}$, the sheet resistance changing merely from 100 ohms/sq to 120 ohms/sq. As already explained with regard to FIG. 1, however, the conversion of the layer near the surface of the semiconductor substrate into an electrically non-conductive layer leads only to a slight reduction of the electrically relevant surface doping concentration of the high doping region 3 from 4E20 cm$^{-3}$ to 3.8E20 cm$^{-3}$, such that contact can be made with the high doping region with a low contact resistance by means of a metallic contact structure. The additional thermal input as a result of the oxidation process can additionally bring about emitter drive-in. As a result, in addition to the conversion into an insulating layer, the surface concentration of the low doping region is reduced.

In an optional method step (not illustrated) following E2, the silicon oxide layer 5 and that region of the semiconductor substrate 1 which has been converted into a silicon oxide layer are removed by means of wet-chemical etching. The removal comprises the following method steps: etching for less than 10 min in 2-10% hydrofluoric acid (HF) in $H_2O$, subsequent rinsing in $H_2O$.

The invention claimed is:

1. A method for producing a selective doping structure in a semiconductor substrate (1) for producing a photovoltaic solar cell,
    wherein the selective doping structure is formed at least at a doping side of the semiconductor substrate, wherein at the doping side at least one planar low doping region (4) of a first doping profile is produced in the semiconductor substrate (1) and at least one local high doping region (3) of a second doping profile is produced within the first low doping region,
    wherein the low doping region (4) and the high doping region (3) are formed with a same doping type and the high doping region has a lower transverse conduction resistance than the low doping region (4),
    the method comprises the following method steps:
    A applying a dopant-containing doping layer (2) to the doping side of the semiconductor substrate,
    B locally heating a melting region of the doping layer (2) and a melting region—situated below the doping layer (2)—of the semiconductor substrate, in such a way that a melt mixture comprised of at least the melting region of the doping layer (2) and the melting region of the semiconductor substrate momentarily forms in a local region, wherein, via liquid-liquid diffusion, dopant diffuses from the doping layer (2) into the molten semiconductor substrate (1), such that the high doping region is produced after solidification of the melt mixture,
    C producing the low doping region (4) which is planar by globally heating the semiconductor substrate (1), in such a way that the dopant diffuses from the doping layer (2) into the semiconductor substrate (1),
    D removing the doping layer (2),
    E at least one of removing or converting a layer of the semiconductor substrate at the doping side, in such a way that in a method step E1 a part of the low doping region (4) and of the high doping region (3) that is near a surface is removed, or converting a layer of the semiconductor substrate at the doping side into an electrically non-conductive layer in a method step E2, or performing both method steps E1 and E2,
    wherein the method steps are performed in the sequence A, B, C, D, E or A, C, B, D, E, and
    the method steps A to E are performed without interposition of masking steps.

2. The method as claimed in claim 1, wherein in the method sequence A, C, B, D, E method steps A and C are effected directly successively, or in that method steps A and C are effected simultaneously.

3. The method as claimed in claim 1, wherein method step E further comprising at least one of removing or converting a layer with a predefined thickness, such that the surface doping concentration of the low doping region (4) at the doping side is less than $4 \times 10^{20}$ cm$^{-3}$.

4. The method as claimed in claim 1, wherein the high doping region (3) has a surface doping concentration identical to or higher than that of the low doping region (4).

5. The method as claimed in claim 1, wherein any method step E1 further comprises removing a layer with a thickness of between 1 nm and 300 nm, or method step E2 further comprises converting a layer with a thickness of between 1 nm and 300 nm.

6. The method as claimed in claim 1, wherein the doping layer (2) has a thickness of between 10 nm and 1 μm.

7. The method as claimed in claim 1, wherein the doping layer (2) is applied in a manner containing dopant in a concentration of at least 1 percent by weight.

8. The method as claimed in claim 1, wherein in a method step F a protective layer is applied to the doping side of the semiconductor substrate.

9. The method as claimed in claim 1, wherein method step A further comprises applying the doping layer (2) in a manner covering an entire doping side of the semiconductor substrate.

10. The method as claimed in claim 1, wherein method step E1 further comprises removing the layer by wet-chemical etching, and subsequently removing the layer that forms by potassium hydroxide.

11. The method as claimed in claim 1, wherein in method step E2 the layer conversion is effected by thermal oxidation or by chemical oxidation.

12. The method as claimed in claim 11, wherein the converted layer is subsequently removed.

13. The method as claimed in claim 1, wherein in method step B the local melting is effected in a substantially linear region.

14. The method as claimed in claim 1, wherein the high doping region is formed in a manner covering those regions of the doping side at which a metallic contact structure is applied to the doping side of the semiconductor substrate in later method steps.

15. The method as claimed in claim 1, wherein method step B the local melting is effected by local heating by a laser.

16. The method as claimed in claim 1, wherein method step B for locally melting the semiconductor substrate, heating to at least 1410° C. is effected.

17. The method as claimed in claim 1, wherein method steps B and C the doping regions are produced in such a way that the low doping region (4) completely covers the doping side of the semiconductor substrate and has a multiplicity of high doping regions.

* * * * *